United States Patent [19]
Weng et al.

[11] Patent Number: 6,163,584
[45] Date of Patent: Dec. 19, 2000

[54] SYNCHRONIZATION ELEMENT FOR CONVERTING AN ASYNCHRONOUS PULSE SIGNAL INTO A SYNCHRONOUS PULSE SIGNAL

[75] Inventors: Antonio Weng, Miaoli Hsien; Jung-Tsan Hsu, Taipei, both of Taiwan

[73] Assignee: VIA Technologies, Inc., Hsin-Tien, Taiwan

[21] Appl. No.: 09/328,816

[22] Filed: Jun. 9, 1999

[30] Foreign Application Priority Data

Feb. 26, 1999 [TW] Taiwan ................................. 88102912

[51] Int. Cl.$^7$ ...................................................... H04L 7/00
[52] U.S. Cl. ........................... 375/354; 327/141; 370/503
[58] Field of Search .................................. 375/354, 377, 375/370; 327/141, 145; 370/503

[56] References Cited

U.S. PATENT DOCUMENTS

| | | | |
|---|---|---|---|
| 4,544,914 | 10/1985 | Chang et al. | 340/347 AD |
| 4,935,942 | 6/1990 | Hwang et al. | 375/354 |
| 5,331,669 | 7/1994 | Wang et al. | 375/371 |

*Primary Examiner*—Temesghen Ghebretinsae
*Attorney, Agent, or Firm*—J. C. Patents; Jiawei Hwang

[57] ABSTRACT

A synchronization element for converting an asynchronous pulse signal into a synchronous pulse signal with reference to a clock signal according to the invention. The synchronization element has four flip-flops consisting of a first flip-flop, a second flip-flop, a third flip-flop and a fourth flip-flop, two AND gates, an NAND gate and an inverter. The first flip-flop can capture the rising edges of an input signal. The second and third flip-flops can generate a pulse signal synchronous to the reference clock signal according to whether or not the first flip-flop is latched. The fourth flip-flop is used to reset the other flip-flops. The NAND and One of the two AND gates can generate appropriate control signals to control corresponding signals.

8 Claims, 3 Drawing Sheets

SYNCHRONIZATION ELEMENT FOR CONVERTING AN ASYNCHRONOUS PULSE SIGNAL INTO A SYNCHRONOUS PULSE SIGNAL

CROSS-REFERENCE TO RELATED APPLICATION

This application claims the priority benefit of Taiwan application serial no. 88102912, filed Feb. 26, 1999, the full disclosure of which is incorporated herein by reference.

BACKGROUND OF THE INVENTION

1. Field of the Invention

The invention relates to a signal converting element, and in particular to a synchronization element for converting an asynchronous pulse signal into a synchronous pulse signal with reference to a clock signal.

2. Description of the Related Art

In line with the great progress in semiconductor technology, digital circuits are getting increasingly complicated. In order to enhance operating speed and efficiency of a current widely-used personal computer, sub-systems within a computer system can use different operating frequencies. For example, the external operating frequency of a CPU is approximately 66 MHz or 100 MHz while the operating frequency of the PCI is approximately 33 MHz or 66 MHz and the operating frequency of a network interface electrically connected to the PCI is around 10 MHz or 100 MHz. In this multi-operating frequency system, a queue operation is always used to transmit data for increasing its own efficiency. In a queue operation, it is necessary to convert an asynchronous control signal into a control signal which is synchronous to a reference clock signal thereof. Moreover, the sub-systems with different operating frequencies require this kind of signal conversion for normal operations.

FIG. 1 is a block circuit diagram showing a system simultaneously having two operating frequencies. As shown in FIG. 1, data transmission between a mainframe 120 and a peripheral device 110 is implemented by using two queue devices 130 and 145. The mainframe 120 operates with a clock signal CK1 while the peripheral device 110 operates with a clock signal CK2. Data can be transmitted from the peripheral device 110 and stored in a queue 135 of the queue device 130 through a signal line DIN in coordination with a control signal PUSH. The mainframe 120 reads the data from the queue 135 through a signal line DOUT in coordination with a control signal POP. Inversely, data can also be transmitted from the mainframe and stored in a queue 145 of the queue device 140 through a signal line DIN' in coordination with a control signal PUSH'. Similarly, the peripheral device 110 reads the data from the queue 145 through a signal line DOUT' in coordination with a control signal POP'.

Since the mainframe 120 and the peripheral device 110 operate with different reference clock signals CK1 and CK2, an asynchronous pulse signal transmitted from the mainframe 120 or the peripheral device 110 must be converted into a synchronous pulse signal with reference to an internal operating clock by the queue device 130 or the 140 for normal operation.

In the prior art, the state machine of Gray code is commonly used to convert different frequencies of clock signals into the same frequency of clock signals. With a simple principle, a signal is changed only toward one direction by allowing only one bit to be changed. However, using the state machine of Gray code to achieve signal synchronization can only convert a lower frequency clock signal into a higher frequency clock signal. That is, an original input signal (clock signal) must has a larger width than a new reference clock signal. In other words, the prior method cannot be used to convert a higher clock signal into a lower clock signal.

SUMMARY OF THE INVENTION

In view of the above, an object of the invention is to provide an synchronization element for converting an asynchronous pulse signal into a synchronous pulse signal. The synchronization element can receive an input signal and a clock signal and output an output signal. Furthermore, the synchronization element receives a reset signal for resetting the output signal. The synchronization element includes a first flip-flop, a second flip-flop, a third flip-flop, a fourth flip-flop, an inverter, an NAND gate, a first AND gate and a second AND gate. Each of the first flip-flop, the second flip-flop and the third flip-flop has a data input terminal, a clock input terminal, a reset input terminal and an output terminal. The fourth flip-flop has a data input terminal, a clock input terminal, a reset input terminal and a complementary output terminal.

The clock input terminal and the data input terminal of the first flip-flop are electrically connected to the input signal and a high potential, respectively. The data input terminal and the clock input terminal of the second flip-flop are electrically connected to the output terminal of the first flip-flop and the clock signal. All the reset input terminal of the second flip-flop, the third flip-flop and the fourth flip-flop are electrically connected to the reset signal.

Both input terminals of the first AND are electrically connected to the output terminal of the second flip-flop and the complementary output terminal of the fourth flip-flop. The output terminal of the first AND gate is electrically connected to the data input terminal of the third flip-flop.

The third flip-flop has its own clock input terminal electrically be connected to the clock signal and its own output terminal send out the output signal.

The data input terminal of the fourth flip-flop is electrically connected to the output terminal of the third flip-flop. The clock signal is electrically connected to the clock input terminal of the fourth flip-flop through the inverter.

Both input terminals of the NAND gate are electrically connected to the output terminal of the third flip-flop and the complementary output terminal of the fourth flip-flop. Both data input terminal of the second AND are electrically connected to the reset signal and the output terminal of the NAND gate while the output terminal of the second AND gate is electrically connected to the reset input terminal of the first flip-flop.

The input signal is an asynchronous pulse signal referred to as a clock signal. Each of the first flip-flop, the second flip-flop, the third flip-flop and the fourth flip-flop can be a D flip-flop.

Furthermore, another synchronization element for converting an asynchronous pulse signal into a synchronous pulse signal according to the invention, which receives an input signal and a clock signal and transmit an output signal is provided, wherein the input signal is an asynchronous pulse signal referred to as a clock signal. The synchronization element includes a first flip-flop, a second flip-flop, a third flip-flop and a fourth flip-flop.

The first flip-flop receives the input signal, and the output terminal signal of the first flip-flop is set at a high logic level at rising edge of the input signal. The second flip-flop receives the output terminal signal of the first flip-flop, and the output terminal signal of the second flip-flop is changed into another state at the rising edge of the clock signal. For example, the output terminal signal of the second flip-flop is changed into another state, such as from a low logic level to a high logic level or from a low logic level to a high logic level on a subsequent rising edge of the clock signal when the output signal of the first flip-flop is at a high logic level or a low logic level.

The third flip-flop receives the output terminal signal of the second flip-flop, and the state terminal signal of the third flip-flop is changed into another state, such as from a high logic level to a low logic level or a low logic level to a high logic level, on a subsequent rising edge of the clock signal when the output terminal signal of the second flip-flop is changed into another state.

The fourth flip-flop receives the output terminal signal of the third flip-flop, and the output terminal signal of the fourth flip-flop is changed into another state, such as from a high logic level to a low logic level or from a low logic level to a high logic level, at a falling edge of the clock signal when the output terminal signal of the third flip-flop is changed into another state.

The output terminal signal of the fourth flip-flop is transmitted to the first flip-flop and the third flip-flop. When the output terminal signal of the fourth flip-flop is changed into another state, the output terminal signal of the first flip-flop is changed back to the original state. Moreover, the output terminal signal of the third flip-flop is changed back to the original state on a subsequent rising edge of the clock signal.

After the output terminal signal of the first flip-flop is changed back to the original state, the output terminal signal of the second flip-flop is changed back to the original state on a subsequent rising edge of the clock signal. When the output terminal signal of the third flip-flop is changed back to the original state the output terminal signal of the fourth flip-flop is changed back to the original state on a subsequent rising edge of the clock signal.

In the above-stated synchronization element for converting an asynchronous pulse signal into a synchronous pulse signal, it is not necessary to limit the width of the input clock signal. As long as an input signal is a pulse signal, it can be converted into a synchronous pulse signal. Therefore, the synchronization element has a function to convert a higher frequency clock signal to a lower frequency clock signal.

BRIEF DESCRIPTION OF THE DRAWINGS

The invention will be more fully understood from the detailed description given hereinbelow and the accompanying drawings which are given by way of illustration only, and thus do not limit the present invention, wherein.

DETAILED DESCRIPTION OF THE PREFERRED EMBODIMENTS

Figure 1:
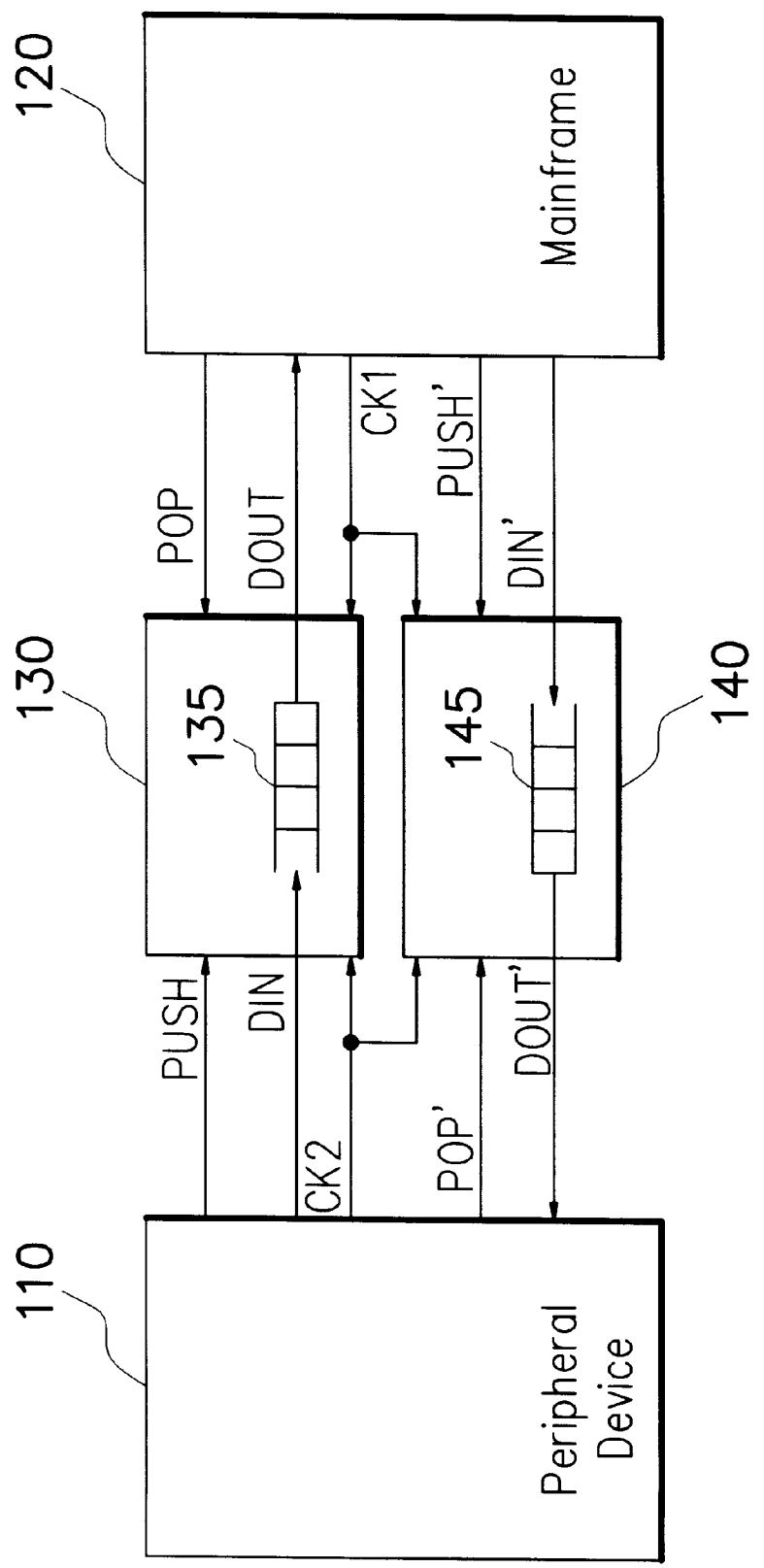
FIG. 1 is a block circuit diagram showing a system simultaneously having two operating frequencies.
Figure 2:
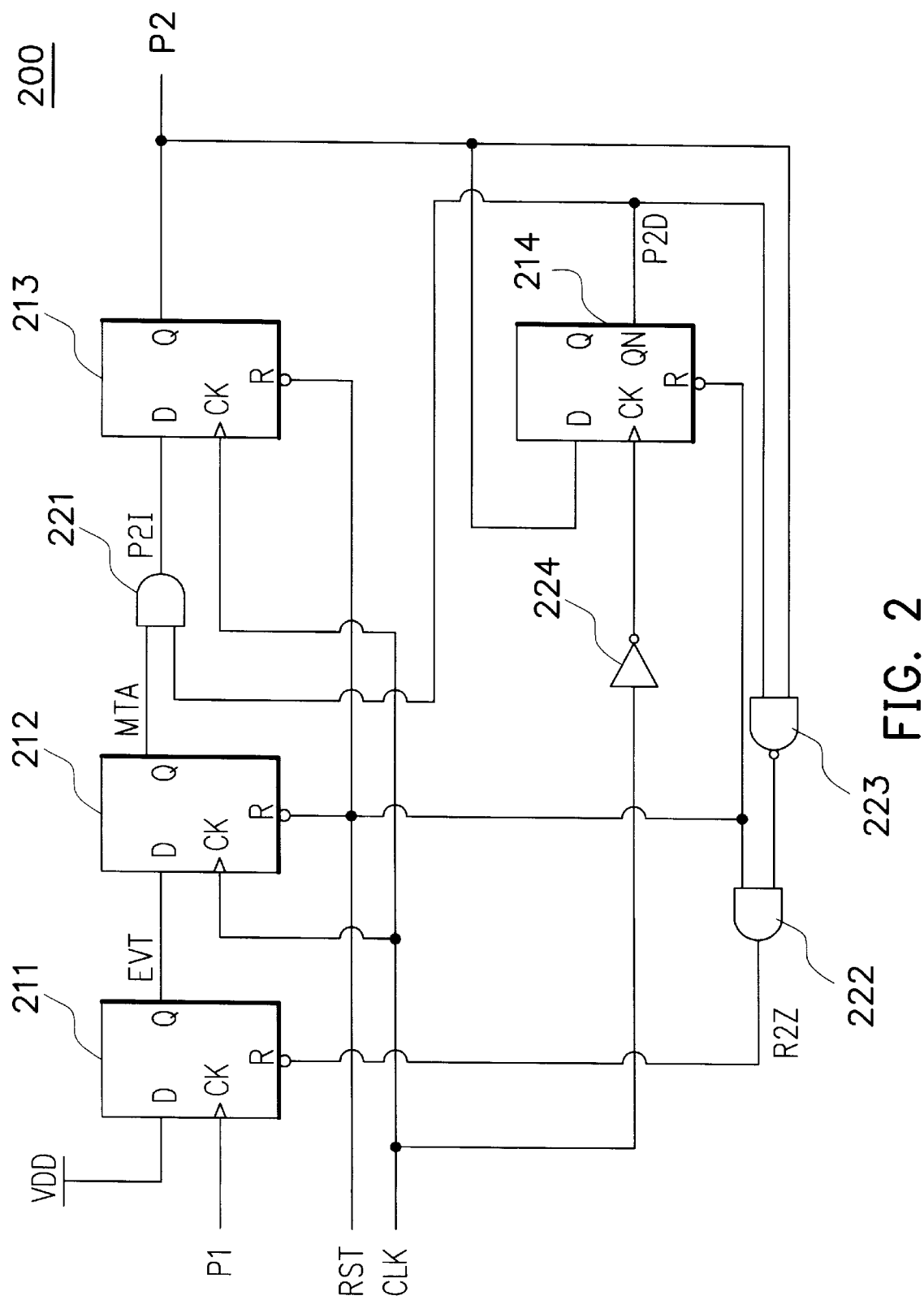
FIG. 2 is a circuit diagram showing a synchronization element according to the invention.

FIG. 2 is a circuit diagram showing a synchronization element 200 for converting an asynchronous pulse signal into a synchronous pulse signal according to the invention.

Referring to FIG. 2, the synchronization element 200 is mainly used to convert an input signal P1 into an output signal P2 synchronous to a clock signal CLK, wherein the input signal P1 is a pulse signal with a longer or shorter time period width than the clock signal CLK. A reset signal RST is used to reset the output signal P2 back to the original logic level. For example, when the reset signal RST is activated at a low logical level, the output signal P2 is reset at a low logic level.

As shown in FIG. 2, the synchronization element 200 includes four flip-flops 211, 212, 213 and 214, two AND gates 221 and 222, an NAND gate 223 and an inverter 224. Each of the four flip-flops 211, 212, 213 and 214 can be a D flip-flop or the like. Assume that a signal received by the data input terminal D of each flip-flop is latched on each rising edge of a corresponding signal input to its own clock input terminal. Furthermore, whenever the reset input terminal R of each flip-flop is set at a low logic level, the output signal output from the output terminal Q thereof is forcedly changed into a low logic level while the output signal output from the complementary output terminal QN thereof is forcedly changed into a high logic level (only shown for the flip-flop 214).

Referring further to FIG. 2, the flip-flop 211 has its own data input terminal D electrically connected to a power source VDD and its own clock input terminal CK electrically connected to the input signal P1. When the input signal P1 changes from a low logic level to a high logic level, i.e., the input signal P1 is on a rising edge, the output terminal Q of the flip-flop 211 is at a high logic level.

The data input terminal D of the flip-flop 212 is electrically connected to the output terminal Q of the flip-flop 211. After the output terminal D of the flip-flop 211 has its own output signal changed into a high logic level, the output signal output from the output terminal Q of the flip-flop 212 is changed into a high logic level on a subsequent rising edge of the clock signal CLK. Moreover, the output terminal Q of the flip-flop 212 and the complementary output terminal QN of the flip-flop 214 are electrically connected to both input terminals of the AND gate 221, respectively. The output terminal of the AND gate 221 is electrically connected to the data input terminal D of the flip-flop 213. If the complementary output terminal QN of the flip-flop 214 is originally at a high logic level, the output signal output from the output terminal of the AND gate 221 is changed into a high logic level after the output terminal Q of the flip-flop 212 has its own output signal changed into a high logic level. In this case, the output signal coming from the output terminal Q of the flip-flop 213 is changed into a high logic level on a subsequent rising edge of the clock signal. That is, the output signal P2 is changed to a high logic level. That is, the output signal P2 is at a high logic level.

The output terminal Q of the flip-flop 213 and the complementary output terminal QN of the flip-flop 214 are electrically connected to both input terminals of the NAND gate 223, respectively. When the output terminal Q of the flip-flop 213 and the complementary output terminal QN of the flip-flop 214 both are simultaneously at a high logic level, the output terminal of the NAND 223 is at a low logic level. Furthermore, both input terminals of the AND gate 222 are electrically connected to the reset signal RST and the output terminal of the NAND gate 223. The output terminal of the AND gate 222 is electrically connected to the reset input terminal R of the flip-flop 211. When the output terminal of the NAND gate 223 is at a low logic level, the output terminal of the AND gate 222 is also at a low logic level. As a result, the flip-flop 211 is reset to enable the output terminal Q thereof recovered to the original logic level.

The data input terminal D of the flip-flop 214 is electrically connected to the output terminal Q of the flip-flop 213 while the clock signal CK is electrically connected to the clock input terminal CK of the flip-flop 214 through the inverter 224. After the output terminal Q of the flip-flop 213 is at a high logic level, the complementary output terminal QN of the flip-flop 214 has its own potential changed to a low logic level on a subsequent falling edge of the clock signal CLK (i.e., on a rising edge of the inverted clock signal input to the clock input terminal CK of the flip-flop 214 with its own potential changed from a low logic level to a high logic level).

After the output terminal Q of the flip-flop 211 has its own potential changed to a low logic level, the signal MTA output from the output terminal Q of the flip-flop 212 is changed into a low logic level on a subsequent rising edge of the clock signal CLK. Simultaneously, the output terminal Q of the flip-flop 213 has its own potential changed into a low logic level because the output terminal of the AND gate 221 is at a low logic level. That is, the output signal P2 is at the original low logic level. Finally, after the output signal P2 has its own potential changed into a low logic level, the signal P2D output from the complementary output terminal QN of the flip-flop 214 is changed into the original high logic level on a subsequent falling edge of the clock signal CLK.

In short, the flip-flop 211 is primarily used to capture a rising edge of the input signal P1. In other words, the flip-flop 211 is latched on a rising edge of the input signal P1. The flip-flops 212 and 213 can generate the output signal P2 synchronous to the reference clock signal CLK according to whether or not the flip-flop 211 is latched. Moreover, the flip-flop 214 is used to reset the other flip-flops, and therefore the output signal P2 can be maintained at an expected logic level only for one cycle and recovered to an original logic level. With the use of the AND gates 221 and 222 and the NAND gate 223, appropriate control signals can be provided to control corresponding signals.

As can be obviously known from the above, the synchronization element of the invention operates in a case of positive logic. If it is necessary to apply the synchronization element in a case of negative logic, a number of additional logic devices, such as inverters, are required.

Figure 3:
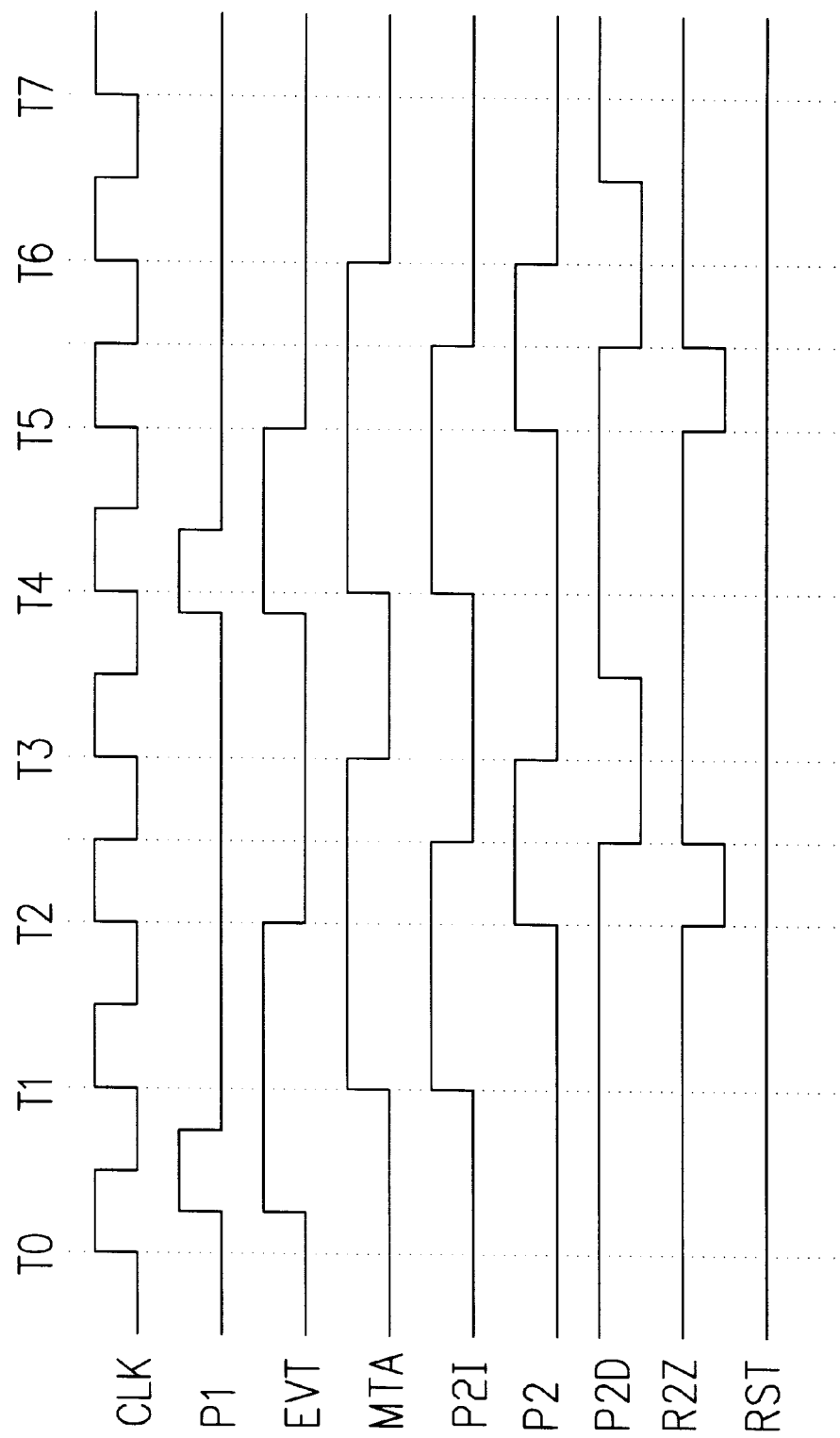
FIG. 3 is a timing chart of a synchronization element according to the invention.

FIG. 3 shows a timing chart of the synchronous element of the invention for further clearly describing the operation thereof.

Referring to FIG. 3, reference symbol EVT designates a signal output from the output terminal Q of the flip-flop 211. Reference symbol MTA designates a signal output from the output terminal Q of the flip-flop 212. Reference symbol P2I designates a signal output from the output terminal of the AND gate 221. Reference symbol P2D designates a signal output from the complementary output terminal QN of the flip-flop 214. Reference symbol R2Z designates a signal output from the AND gate 222. And, reference symbol CLK designates a clock signal serving as a reference for the description of the timing chart.

As shown in FIG. 3, the input signal P1 is a pulse shorter than the period of the clock signal CLK after a cycle T0. When the input signal P1 has its own potential changed from a low logic level to a high logic level, the flip-flop 211 captured this change to have the output signal EVT changed into a high logic level.

Thereafter, the signal MTA output from the output terminal Q of the flip-flop 212 is changed into a high logic level on a subsequent rising edge of the clock signal CLK during a cycle T1. At the same time, since the signal P2D output from the output terminal QN of the flip-flop 214 is at a high logic level, the signal P2I output from the output terminal of the AND gate 221 is changed into a high logic level.

Next, the signal P2 output from the output terminal Q of the flip-flop 213 is changed into a high logic level on a rising edge of the clock signal CLK during a cycle T2. Since the output terminal Q (i.e., the output signal P2) of the flip-flop 213 and the complementary output terminal QN (i.e., the signal P2D) of the flip-flop 214 both are at a high logic level, the signal R2Z output from a logic combination circuit of the NAND gate 223 and the AND gate 222 is changed into a low logic level to reset the flip-flop 211, thereby changing the signal EVT back to a low logic level.

Additionally, since the output signal P2 output from the flip-flop 213 is at a high logic level, and the clock signal CLK is transmitted to the clock input terminal CK of the flip-flop 214 through the inverter 224, the signal P2D output from the complementary output terminal QN of the flip-flop 214 is changed into a low logic level on a falling edge of the clock signal CLK during a cycle T2. At the same time, the signal P2I coming from the AND gate 221 is also changed into a low logic level.

Subsequently, the signal MTA output from the flip-flop 212 and the signal P2 output from the flip-flop 213 both are recovered to a low logic level on a rising edge of the clock signal CLK during a cycle T3. Then, the complementary output terminal QN of the flip-flop 214 has its own potential recovered to a high logic level on a falling edge of the clock signal CLK during a cycle T3. As such, the signal conversion is completely achieved.

Moreover, signal conversion when the input signal P1 shows a second pulse will be described in the following.

As shown in FIG. 3, the input signal P1 has its own potential changed into a high logic level before a rising edge of the clock signal CLK during a cycle T4, and then recovered to a low logic level after a short period of time. When the input signal P1 has its own potential changed from a low logic level to a high logic level (i.e. on a rising edge), the flip-flop 211 captures this variation to enable the signal EVT output from the output terminal Q thereof to change into a high logic level.

Since the signal P2 output from the output terminal Q of the flip-flop 213 is at a high logic level, the signal P2D output from the complementary output terminal QN of the flip-flop 214 is changed into a low logic level on a falling edge of the clock signal CLK during a cycle T5 in coordination with the used inverter 224 as shown in FIG. 2.

The signal MTA output from the flip-flop 212 and the signal 132 output from the flip-flop 213 both are recovered to a low logic level on a rising edge of the clock signal CLK during a cycle T6. Then, the complementary output terminal QN of the flip-flop 214 has its own potential changed back into a high logic level on a falling edge of the clock signal CLK during a cycle T6. To this point, the signal conversion is completely achieved.

As described above, whether the input signal P1 has a shorter or longer time period width or whether the input signal P1 is synchronous to the reference clock signal CLK or not, the synchronization element according to the invention can capture change of the input signal P1, and then generate the output signal P2 which is synchronous to the clock signal CLK and has a time period width equal to the period of the clock signal CLK.

In summary, the synchronization element for converting an asynchronous pulse signal into a synchronous pulse signal according to the invention has the following advantages. It is unnecessary to limit the time period width of the input signal. In other words, the time period width of the input signal is optional if the input signal is a pulse signal. Therefore, a higher frequency pulse signal can be converted into a lower frequency pulse signal by the inventive synchronization element.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A synchronization element for converting an asynchronous pulse signal into a synchronous pulse signal which receives an input signal, a clock signal and a reset signal and transmits an output signal, the synchronization element comprising:

a first flip-flop having a data input terminal electrically connected to a high logic level, a clock input terminal electrically connected to the input signal, a rest data input terminal electrically connected to the rest signal and an output terminal;

a second flip-flop having a data input terminal electrically connected to the output terminal of the first flip-flop, a clock input terminal electrically connected to the clock signal, a reset input terminal electrically connected to the reset signal and an output terminal;

a first AND gate having a first data input terminal electrically connected to the output terminal of the second flip-flop, a second data input terminal and an output terminal;

a third flip-flop having a data input terminal electrically connected to the output terminal of the first AND gate, a clock input terminal electrically connected to the clock signal, a reset input terminal electrically connected to the reset signal and an output terminal electrically connected to the output signal;

an inverter having a data input terminal electrically connected to the clock signal and an output terminal;

a fourth flip-flop having a data input terminal electrically connected to the output terminal of the third flip-flop, a clock input terminal electrically connected to the output terminal of the inverter, a reset input terminal electrically connected to the reset signal and a complementary output terminal electrically connected to the second data input terminal of the first AND gate;

an NAND gate having both input terminals electrically connected to the output terminal of the third flip-flop and the complement output terminal of the fourth flip-flop, respectively, and an output terminal; and a second AND gate having both input terminals electrically connected to the reset signal and the output terminal of the NAND gate, respectively, and an output terminal.

2. The synchronization element for converting an asynchronous pulse signal into a synchronous pulse signal as defined in claim 1, wherein the input signal is a pulse signal.

3. The synchronization element for converting an asynchronous pulse signal into a synchronous pulse signal as defined in claim 1, wherein the first flip-flop is a D flip-flop.

4. The synchronization element for converting an asynchronous pulse signal into a synchronous pulse signal as defined in claim 1, wherein the second flip-flop is a D flip-flop.

5. The synchronization element for converting an asynchronous pulse signal into a synchronous pulse signal as defined in claim 1, wherein the third flip-flop is a D flip-flop.

6. The synchronization element for converting an asynchronous pulse signal into a synchronous pulse signal as defined in claim 1, wherein the fourth flip-flop is a D flip-flop.

7. A synchronization element for converting an asynchronous pulse signal into a synchronous pulse signal, which receives an input signal and a clock signal and transmits a last output signal, wherein the input signal is a pulse signal, the synchronization element comprising:

a first flip-flop receiving the input signal, wherein an output terminal thereof has its own output signal of which an original logic level is changed to a logic level at a rising edge of the input signal;

a second flip-flop receiving the output signal output from the output terminal of the first flip-flop, wherein an output terminal of the second flip-flop has its own output signal of which an original logic level is changed to a logic level at a subsequent rising edge of the clock signal after the logic level of the output signal output from the first flip-flop has changed;

a third flip-flop receiving the output signal output from the output terminal of the second flip-flop, wherein an original logic level of the last output signal output from an output terminal of the third flip-flop is changed into a logic level at a subsequent rising edge of the clock signal after the logic level of the output signal output from the first flip-flop has changed; and a fourth flip-flop receiving the last output signal output from the output terminal of the third flip-flop, wherein an original logic level of an output signal output from an output terminal of the fourth flip-flop is changed into a logic level at a subsequent falling edge of the clock signal after the logic level of the output signal output from the first flip-flop has changed; wherein-the output signal output from the output terminal of the fourth flip-flop is electrically connected to the first flip-flop and third flip-flop;

after the output terminal of the fourth flip-flop has its own output signal with its own the logic level being changed, the output signal output from the output terminal of the first flip-flop is recovered to the original logic level, and the output signal output from the output terminal of the third flip-flop is recovered to the original logic level at a subsequent rising edge of the clock signal;

after the output terminal of the first flip-flop has its own output signal recovered to the original logic level, the output signal output from the output terminal of the second flip-flop is recovered to the original logic level at a subsequent rising edge of the clock signal, and after the output terminal of the third flip-flop has the last output signal recovered to the original logic level, the output signal output from the output terminal of the fourth flip-flop is recovered to the original logic level at a subsequent falling edge of the clock signal.

8. The synchronization element for converting an asynchronous pulse signal into a synchronous pulse signal as defined in claim 7, wherein the synchronization element further receives a reset signal, wherein the output terminal of each the first flip-flop, the second flip-flop, the third flip-flop and the fourth flip-flop has its own output signal recovered to the original logic level when the reset signal is activated.

* * * * *